United States Patent
Xiong et al.

(10) Patent No.: US 10,203,386 B2
(45) Date of Patent: Feb. 12, 2019

(54) METHOD AND APPARATUS FOR SETTING A SCANNING PROTOCOL FOR CONDUCTING A MEDICAL EXAMINATION

(71) Applicant: Siemens Shenzhen Magnetic Resonance Ltd., Shenzhen (CN)

(72) Inventors: Jun Xiong, Shenzhen (CN); Zhi Gen Yang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 298 days.

(21) Appl. No.: 15/015,314

(22) Filed: Feb. 4, 2016

(65) Prior Publication Data

US 2016/0223633 A1 Aug. 4, 2016

(30) Foreign Application Priority Data

Feb. 4, 2015 (CN) .......................... 2015 1 0059414

(51) Int. Cl.
*G01R 33/54* (2006.01)

(52) U.S. Cl.
CPC ................... *G01R 33/543* (2013.01)

(58) Field of Classification Search
CPC ....................................... G01R 33/543
See application file for complete search history.

(56) References Cited

U.S. PATENT DOCUMENTS

| 2011/0113376 A1* | 5/2011 | Suzuki ........................ 715/833 |
| 2012/0203106 A1* | 8/2012 | Matsunaga .................. 600/443 |
| 2017/0343626 A1* | 11/2017 | Tomiha .................. G01R 33/36 |

\* cited by examiner

*Primary Examiner* — Rodney A Bonnette
(74) *Attorney, Agent, or Firm* — Schiff Hardin LLP

(57) ABSTRACT

In a method and medical equipment for selecting a scanning protocol set, a preset virtual scanned object model including multiple scanned areas is loaded into a computer. The virtual scanned object model is a graphic or image model. A scanned area is selected by use of the virtual scanned object model. A default scanning protocol is set corresponding to the selected scanned area according to a preset correlation between the scanned area and the scanning protocol set, so as to complete the selection of the scanning protocol set.

16 Claims, 2 Drawing Sheets

METHOD AND APPARATUS FOR SETTING A SCANNING PROTOCOL FOR CONDUCTING A MEDICAL EXAMINATION

BACKGROUND OF THE INVENTION

Field of the Invention

The present invention concerns medical equipment, and particularly a method for selecting a scanning protocol set, and an apparatus and medical equipment for implementing such a method.

Description of the Prior Art

Before a scan (i.e., an acquisition of raw data from a patient for conversion into image data), such as a magnetic resonance imaging (MRI) scan, is performed on a patient, it is usually required to complete the registration of the patient, i.e., to enter basic information about the patient and to then select an appropriate scan protocol. When the scan protocol is selected, it is usually required to first select a text version of a protocol tree and select a corresponding scanned part node from the protocol tree, and then a scanning protocol set is selected from a protocol library of the scanned part node for the current scanning. The "scanning protocol set" in the present application refers to a set of related protocols required for the examination of a patient, and includes multiple parameter settings, and is also called a scanning protocol. In addition, it is sometimes required to select the left or the right part, such as the left knee or the right knee. Generally, a mouse needs to be clicked three to six times to complete these steps.

SUMMARY OF THE INVENTION

In view of this state of the art, an object of the present invention is to provide a method for selecting a scanning protocol set and an apparatus for selecting a scanning protocol set, and medical equipment, so as to achieve selecting a scanning protocol set more quickly and more visually intuitively compared to conventional techniques.

The method for selecting a scanning protocol set in accordance with the present invention includes loading a preset virtual scanned object model that includes multiple scanned areas in a computer, wherein the virtual scanned object model is a graphic or image model. A scanned area is selected using the virtual scanned object. A default scanning protocol is set corresponding to the selected scanned area according to a preset correlation between the scanned area and the scanning protocol set, so as to complete the selection of the scanning protocol set.

In an embodiment, the method further includes determining a potential area to be scanned according to current scanning relevant information and, after loading the preset scanned object graphic or image model including multiple scanned areas, further includes indicating the area to be scanned in the virtual scanned object model.

In another embodiment, the relevant current scanning information includes at least one of a currently used coil, height and positioning information about a current scanned object, and register and diagnostic information about the current scanned object in a hospital information system.

In another embodiment, the step of loading a preset virtual scanned object model including multiple scanned areas further includes making the presentation direction of the virtual scanned object model coincide with the positioning direction of the current scanned object on the table of an a patient support according to the positioning direction.

In an embodiment, the method further includes at least one of the following processes.

One option is to receive a default scanning protocol set configured by a user for a scanned area in the virtual scanned object model, and then establish a correlation between the scanned area and the default scanning protocol set.

Another option is to receive a delete operation from a user for a default scanning protocol set of a scanned area in the virtual scanned object model, and then delete a correlation between the scanned area and the default scanning protocol set.

Another option is to receive an update operation from a user for a default scanning protocol set of a scanned area in the virtual scanned object model, and then update a correlation between the scanned area and the default scanning protocol set;

Another option is to receive an alternative scanning protocol set configured by a user for a scanned area in the virtual scanned object model, and then establish a correlation between the scanned area and the alternative scanning protocol set.

Another option is to receive a delete operation from a user for an alternative scanning protocol set of a scanned area in the virtual scanned object model, and then delete a correlation between the scanned area and the alternative scanning protocol set.

Another option is to receive a change operation from a user for an alternative scanning protocol set and a default scanning protocol set of a scanned area in the virtual scanned object model, and then change a correlation between the scanned area and the alternative scanning protocol set and a correlation between the scanned area and the default scanning protocol set, so as to make the alternative scanning protocol set change to be a default scanning protocol set corresponding to the scanned area.

The apparatus for selecting a scanning protocol set, according to the present invention has the following components. A model presentation computer has a preset virtual scanned object model loaded therein, the virtual scanned object mode 1 including multiple scanned areas and being a graphic or image model. The computer has a scanned area determination processor designed to obtain a scanned area selected using the virtual scanned object model. The computer has a protocol set selection processor designed to obtain a default scanning protocol set corresponding to the selected scanned area according to a preset correlation between the scanned area and the scanning protocol set, so as to complete the selection of the scanning protocol set.

In an embodiment, the apparatus further has an area-to-be-scanned determination processor designed to determine a potential area to be scanned according to current scanning relevant information, and the model presentation computer is further configured to indicate, after the preset virtual scanned object model including multiple scanned areas is loaded therein, the area to be scanned in the virtual scanned object model.

In another embodiment, the area-to-be-scanned determination processor is designed to determine the potential area to be scanned according to at least one of the following current scanning relevant information: a currently used coil, height and positioning information about a current scanned object, and register and diagnostic information about the current scanned object in a hospital information system.

In another embodiment, the model presentation computer is configured to load the preset virtual scanned object model including multiple scanned areas according to the positioning direction of the current scanned object on the table board of an examining table, so as to make the presentation direction of the virtual scanned object model coincide with the positioning direction.

In another embodiment, the protocol set configuration processor is configured to execute at least one of the following processes.

One option is to receive a default scanning protocol set configured by a user for a scanned area in the virtual scanned object model, and then establish a correlation between the scanned area and the default scanning protocol set.

Another option is to receive a delete operation from a user for a default scanning protocol set of a scanned area in the virtual scanned object model, and then delete a correlation between the scanned area and the default scanning protocol set.

Another option is to receive an update operation from a user for a default scanning protocol set of a scanned area in the virtual scanned object model, and then update a correlation between the scanned area and the default scanning protocol set;

Another option is to receive an alternative scanning protocol set configured by a user for a scanned area in the virtual scanned object model, and then establish a correlation between the scanned area and the alternative scanning protocol set.

Another option is to receive a delete operation from a user for an alternative scanning protocol set of a scanned area in the virtual scanned object model, and then delete a correlation between the scanned area and the alternative scanning protocol set.

Another option is to receive a change operation from a user for an alternative scanning protocol set and a default scanning protocol set of a scanned area in the virtual scanned object model, and then change a correlation between the scanned area and the alternative scanning protocol set and a correlation between the scanned area and the default scanning protocol set, so as to make the alternative scanning protocol set change to be a default scanning protocol set corresponding to the scanned area.

The medical equipment in accordance with the present invention has an apparatus for selecting a scanning protocol set as described above.

It can be seen from the above-described solution that, since a virtual scanned object model which can present multiple scanned areas is provided in advance in the present invention, the virtual scanned object model being a visual graphic or image model, and a correlation between a scanned area and a scanning protocol set is established in advance, the scanned area can be selected visually and quickly by using the virtual scanned object model, and then a default scanning protocol set corresponding to the selected scanned area is obtained according to the preset correlation between the scanned area and the scanning protocol set, so as to complete the selection of the scanning protocol set. By this method, the selection of the scanning protocol set can be completed quickly and visually by one click at a corresponding scanned area of the virtual scanned object model at most.

In addition, by determining an area to be scanned in advance and indicating the area to be scanned in the virtual scanned object model, a user can be assisted in determining a scanned area more visually, so as to determine a corresponding default protocol set by the selected scanned area, thereby further completing the selection of the scanning protocol set quickly and visually.

Further, by loading a preset virtual scanned object model including multiple scanned areas in such a manner that the presentation direction coincides with the positioning direction of the current scanned object on the table board of an examining table according to the positioning direction, the virtual scanned object model presents a scanned area corresponding to the current scanning operation more visually.

In addition, in the embodiments of the present invention, not only can a correlation between a scanned area and a scanning protocol set be provided by the system, but also a user can edit the correlation between the scanned area and the scanning protocol set, including operations such as configuration, addition, deletion and change, so as to increase the use flexibility of the technical solutions of the present invention.

DESCRIPTION OF THE PREFERRED EMBODIMENTS

Figure 1:
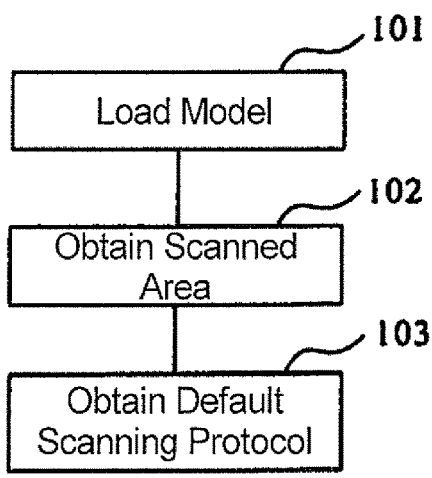
FIG. 1 is an exemplary flowchart of a method for selecting a scanning protocol set according to the embodiments of the present invention.

In the drawings, the reference numerals are as follows:
101: Loading a preset virtual scanned object model including a plurality of scanned areas;
102: Obtaining a scanned area selected by a user through the virtual scanned object model;
103: Obtaining a default scanning protocol set corresponding to the selected scanned area;
20, 30: Area to be scanned
401: Model presentation module;
402: Scanned area determination module;
403: Protocol set selection module;
404: Area-to-be-scanned determination module;
405: Protocol set configuration module.

FIG. 1 is an exemplary flowchart of a method for selecting a scanning protocol set according to the embodiments of the present invention. As shown in FIG. 1, the method may comprise the steps as follows:

In step 101, a preset virtual scanned object model including a plurality of scanned areas is loaded, wherein the virtual scanned object model is a graphic or image model.

Figure 2:
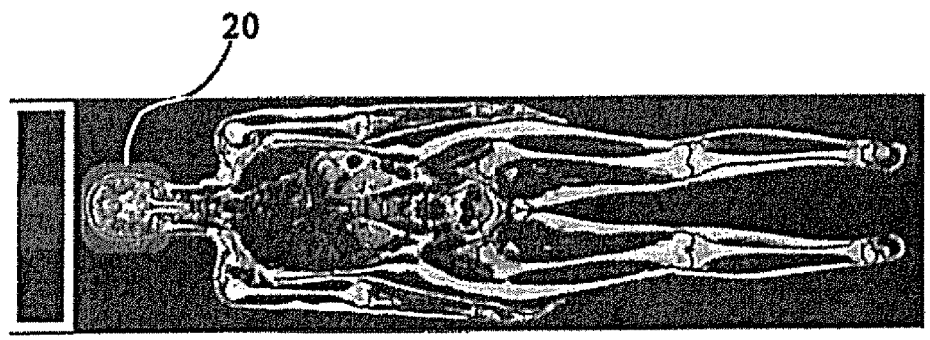
FIG. 2 is a schematic illustration of a virtual human body model according to the embodiments of the present invention.

In the present embodiment, the virtual scanned object model may be a virtual human body model. As shown in FIG. 2, FIG. 2 is a schematic diagram of a virtual human body model according to the present embodiment. In other embodiments, the virtual scanned object model may also be a virtual animal model, etc.

In the present embodiment, the virtual scanned object model may be a 2D model and may also be a 3D model, may be an anatomic image model as shown in FIG. 2 and may also be an animation model covered with skin, or a collected picture model, etc.

The scanned area in the present embodiment may comprise but is not limited to at least one of the following areas: the head, the neck, the shoulders (left shoulder and right shoulder), the chest, the spine, the abdomen, the knees (left knee and right knee), the feet (left foot and right foot), the elbows (left elbow and right elbow), the wrists (left wrist and right wrist), etc.

In step 102, a scanned area selected by means of the virtual scanned object model is obtained.

In the present embodiment, a user may directly click on a corresponding scanned area in the virtual scanned object model to complete the selection of the current scanned area.

In step 103, a default scanning protocol set corresponding to the selected scanned area is obtained according to a preset correlation between the scanned area and the scanning protocol set, so as to complete the selection of the scanning protocol set.

In the present embodiment, one scanned area may correspond to at least one scanning protocol set; however, generally one scanned area only corresponds to one default scanning protocol set, so that when a scanned area is selected, a scanning protocol set required by the current scanned area may directly correspond thereto according to the correlation between the scanned area and the scanning protocol set.

The correlation between the scanned area and the scanning protocol set is set in the system in advance, and may also be set or edited by a user at the same time, so as to increase the use flexibility of the solution.

For example, the method may further comprise at least one of the following processes:

receiving a default scanning protocol set configured by a user for a scanned area in the virtual scanned object model, and establishing a correlation between the scanned area and the default scanning protocol set;

receiving a delete operation from a user for a default scanning protocol set of a scanned area in the virtual scanned object model, and deleting a correlation between the scanned area and the default scanning protocol set;

receiving an update operation from a user for a default scanning protocol set of a scanned area in the virtual scanned object model, and updating a correlation between the scanned area and the default scanning protocol set;

receiving an alternative scanning protocol set configured by a user for a scanned area in the virtual scanned object model, and establishing a correlation between the scanned area and the alternative scanning protocol set;

receiving a delete operation from a user for an alternative scanning protocol set of a scanned area in the virtual scanned object model, and deleting a correlation between the scanned area and the alternative scanning protocol set; and receiving a change operation from a user for an alternative scanning protocol set and a default scanning protocol set of a scanned area in the virtual scanned object model, and changing a correlation between the scanned area and the alternative scanning protocol set and a correlation between the scanned area and the default scanning protocol set, making the alternative scanning protocol set change to be a default scanning protocol set corresponding to the scanned area.

Since a virtual scanned object model which can present a plurality of scanned areas is provided in advance in the embodiments of the present invention, the virtual scanned object model is a visual graphic or image model, and a correlation between a scanned area and a scanning protocol set is established in advance, the scanned area can be selected visually and quickly by means of the virtual scanned object model, and then a default scanning protocol set corresponding to the selected scanned area is obtained according to the preset correlation between the scanned area and the scanning protocol set, so as to complete the selection of the scanning protocol set. By means of this method, the selection of the scanning protocol set can be completed quickly and visually by one click at a corresponding scanned area of the virtual scanned object model at most.

Figure 3:
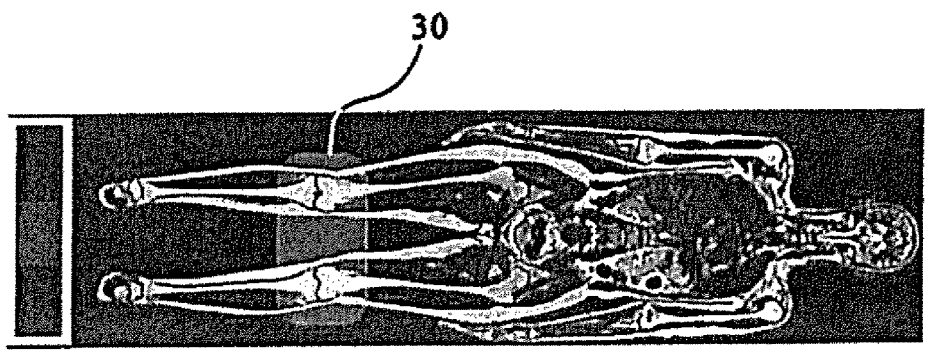
FIG. 3 is a schematic illustration of a different presentation direction of the virtual human body model shown in FIG. 2.

Further, in the present embodiment, a preset virtual scanned object model including a plurality of scanned areas can also be loaded according to the positioning direction of the current scanned object on the table board of an examining table, so as to make the presentation direction of the virtual scanned object model coincide with the positioning direction, so that the virtual scanned object model can present the scanned area corresponding to the current scanning operation more visually. For example, if the positioning direction of the current scanned object on the table board of an examining table is configured such that the head faces a scanning hole, the virtual scanned object model may be presented at a position in which the head faces the scanning hole, as shown in FIG. 2; and if the positioning direction of the current scanned object on the table board of the examining table is configured such that the feet face the scanning hole, the virtual scanned object model may be presented at a position in which the feet face the scanning hole, as shown in FIG. 3. In FIGS. 2 and 3, areas to be scanned 20 and 30 are labelled respectively, and the scanning hole is on the left of the figures.

In the present embodiment, the potential area to be scanned may also be further determined according to the current scanning relevant information; correspondingly, after a preset scanned object graphic or image model including a plurality of scanned areas is loaded in step 101, the area to be scanned may be further indicated in the virtual scanned object model. As indicated in FIG. 2, a rectangular indication area on the head is an area to be scanned 20, and as indicated in FIG. 3, a rectangular indication area on the knee is an area to be scanned 30. In practical application, highlighting or color display, etc. may also be applied thereto to assist a user in determining the scanned area more visually, so that the operation is more visual, and a corresponding default protocol set is further determined by the selected scanned area, thereby further completing the selection of the scanning protocol set quickly and visually.

With regard to the case where the area to be scanned is indicated, in step 102, the user may directly click the indicated scanned area to complete the selection of the scanned area, or the system also may automatically regard the indicated area to be scanned as the selected scanned area by default. Of course, the user also may click other scanned areas without selecting the indicated scanned area, and at the moment, the scanned area selected by the user shall prevail.

For the MRI scan, the current scanning relevant information may comprise at least one of the following information: a currently used coil, height and positioning information about a current scanned object, and register and diagnostic information about the current scanned object in a hospital information system.

For other scans, such as a computed tomography (CT) scan, the current scanning relevant information may comprise at least one of the following information: height and positioning information about a current scanned object, register and diagnostic information about the current scanned object in a hospital information system, etc.

In addition, the present embodiment may further comprise: receiving an export or import operation from a user for a correlation between the scanned area and the scanning protocol set in the virtual scanned object model, so as to export or import the correlation between the scanned area and the scanning protocol set from or to a designated area.

Figure 4:
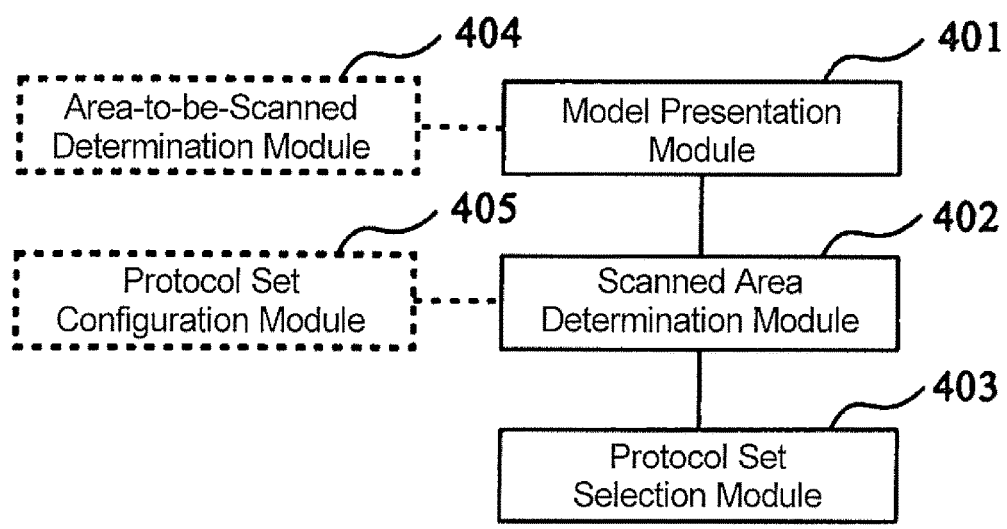
FIG. 4 is an exemplary block diagram of an apparatus for selecting a scanning protocol set according to the embodiments of the present invention.

The method for selecting a scanning protocol set in the embodiments of the present invention has been described in detail hereinabove, and the apparatus for implementing the method in the embodiments of the present invention will be described in detail hereinafter. FIG. 4 is an exemplary structure chart of an apparatus for selecting a scanning protocol set according to the embodiments of the present invention. As shown in FIG. 4, the apparatus may comprise a model presentation module 401, a scanned area determination module 402 and a protocol set selection module 403.

The model presentation module 401 is used for loading a preset virtual scanned object model including a plurality of scanned areas, wherein the virtual scanned object model is a graphic or image model.

The scanned area determination module 402 is used for obtaining a scanned area selected by means of the virtual scanned object model.

The protocol set selection module 403 is used for obtaining a default scanning protocol set corresponding to the selected scanned area according to a preset correlation between the scanned area and the scanning protocol set, so as to complete the selection of the scanning protocol set.

In the apparatus of the present embodiment, the description of the specific operations of various functional modules may be consistent with that of the corresponding steps in the method as shown in FIG. 1, which will not described here.

Corresponding to the method as shown in FIG. 1, in one implementation, the apparatus may further comprise an area-to-be-scanned determination module 404 for determining a potential area to be scanned according to current scanning relevant information. Accordingly, the model presentation module 401 is further used for, after a preset virtual scanned object model including a plurality of scanned areas is loaded, indicating the area to be scanned in the virtual scanned object model.

Corresponding to the method as shown in FIG. 1, in one implementation, for the MRI scan, the area-to-be-scanned determination module 404 may determine the potential area to be scanned according to at least one of the following current scanning relevant information: a currently used coil, height and positioning information about a current scanned object, and register and diagnostic information about the current scanned object in a hospital information system. For the CT scan, the area-to-be-scanned determination module 404 may determine the potential area to be scanned according to at least one of the following current scanning relevant information: height and positioning information about a current scanned object, and register and diagnostic information about the current scanned object in a hospital information system.

Corresponding to the method as shown in FIG. 1, in one implementation, the model presentation module 401 may load a preset virtual scanned object model including a plurality of scanned areas according to the positioning direction of the current scanned object on the table board of an examining table, so as to make the presentation direction of the virtual scanned object model coincide with the positioning direction.

Corresponding to the method as shown in FIG. 1, in one implementation, the apparatus may further comprise a protocol set configuration module 405 for executing at least one of the following processes:

receiving a default scanning protocol set configured by a user for a scanned area in the virtual scanned object model, and establishing a correlation between the scanned area and the default scanning protocol set;

receiving a delete operation from a user for a default scanning protocol set of a scanned area in the virtual scanned object model, and deleting a correlation between the scanned area and the default scanning protocol set;

receiving an update operation from a user for a default scanning protocol set of a scanned area in the virtual scanned object model, and updating a correlation between the scanned area and the default scanning protocol set;

receiving an alternative scanning protocol set configured by a user for a scanned area in the virtual scanned object model, and establishing a correlation between the scanned area and the alternative scanning protocol set;

receiving a delete operation from a user for an alternative scanning protocol set of a scanned area in the virtual scanned object model, and deleting a correlation between the scanned area and the alternative scanning protocol set; and receiving a change operation from a user for an alternative scanning protocol set and a default scanning protocol set of a scanned area in the virtual scanned object model, and changing a correlation between the scanned area and the alternative scanning protocol set and a correlation between the scanned area and the default scanning protocol set, so as to make the alternative scanning protocol set change to be a default scanning protocol set corresponding to the scanned area.

In addition, the present embodiment may further comprise a correlation operation module (not shown in FIG. 4) for receiving an export or import operation from a user for a correlation between the scanned area and the scanning protocol set in the virtual scanned object model to export or import the correlation between the scanned area and the scanning protocol set from or to a designated area.

During one particular implementation, the apparatus for selecting a scanning protocol set also may have internal structures of other forms, for example, the various functional modules mentioned above may be recombined or further refined. Furthermore, the various functional modules may be located in different entities, all of them may also be located in the same entity, and the specific configuration may be performed according to actual requirements.

In addition, all of or a portion of any combination of the functional modules of the apparatus for selecting a scanning protocol set may be implemented with hardware, and may also be computer-executable instructions stored in a computer-readable medium.

When any one or any combination of the various functional modules of the apparatus for selecting a scanning protocol set is computer-executable instructions in the embodiments of the present invention, the apparatus for selecting a scanning protocol set in the embodiments of the present invention may further comprise a processor (not shown in the figure) and a computer-readable storage medium (not shown in the figure).

The processor is used for executing the computer-executable instructions in the computer-readable storage medium.

Any one or any combination of the various functional modules of the apparatus for selecting a scanning protocol set in the embodiment of the present invention is computer-executable instructions stored in the computer-readable storage medium.

Another embodiment of the present invention proposes medical equipment, such as MRI equipment and CT equipment. The medical equipment comprises any one apparatus for selecting a scanning protocol set as mentioned above.

The present invention also provides a machine-readable storage medium which stores instructions for making a machine carry out the method for selecting a scanning protocol set as described herein. Particularly, a system or a device with a storage medium can be provided, on which storage medium there are stored software program codes for implementing the functions of any of the above-mentioned embodiments, and a computer (or CPU or MPU) of the system or device is enabled to read and execute the program codes stored in the storage medium.

In this case, the functions of any of the above-mentioned embodiments can be implemented by the program codes per se read from the storage medium, therefore the program codes and the storage medium storing the program codes constitute a part of the present invention.

The embodiments of the storage medium for providing program codes include a floppy disk, a hard disk, a magnetic optical disk, an optical disk (such as CD-ROM, CD-R, CD-RW, DVD-ROM, DVD-RAM, DVD-RW, and DVD+RW), a magnetic tape, a non-volatile storage card, and a ROM. Selectively, the program codes can be downloaded from a server computer via a communication network.

In addition, it should be noted that the operating system running on the computer can be enabled to complete part of or all of the practical operations, not only by way of executing the program codes read out by the computer, but also by way of instructions based on the program codes, thereby realizing the function of any one of the above-mentioned embodiments.

Furthermore, it should be understood that the program codes read from the storage medium are written into a memory provided in an expansion board in the computer or written into a memory provided in an expansion unit connected to the computer, and then the CPU mounted onto the expansion board or the expansion unit is enabled to implement a part of or all of the practical operations based on the instructions of the program codes, so that the functions of any one of the above-mentioned embodiments can be achieved.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for selecting a scanning protocol set, comprising:
   loading a preset virtual scanned object model, selected from the group consisting of a graphic model and an image model, into a computer, said scanned object model including a plurality of modeled scan areas;
   providing said computer with height and positioning information for a subject to be scanned in a scan of the subject conducted with a medical imaging apparatus;
   providing said computer with a manually selected default scanning protocol for operating said medical imaging apparatus to conduct said scan;
   in said computer, executing an algorithm to select one modeled scan area, among said plurality of modeled scan areas, dependent on said height and positioning information;
   in said computer, further executing said algorithm to select a selected scanning protocol according to a preset correlation between said selected scanning protocol and the selected one model scan area;
   in said computer, completing said default scanning protocol with said selected scanning protocol in order to produce a completed scanning protocol; and
   from said computer, providing control signals to said medical imaging apparatus corresponding to said completed scanning protocol in order to operate said medical imaging apparatus so as to conduct said scan of the subject according to said completed scanning protocol.

2. The method as claimed in claim 1, further comprising:
   in said computer, determining, from said height and positioning information, a positioning direction of the subject on a table board of an examination table of the medical imaging apparatus; and
   in said computer, making a presentation direction of said virtual scanned object model coincide with said positioning direction.

3. The method as claimed in claim 1 wherein said correlation is a first correlation, and further comprising:
   in said computer, executing said algorithm so as to also establish a second correlation between said one modeled scan and the default scanning protocol set; and
   selecting said selected scan protocol also according to said second correlation.

4. The method as claimed in claim 3, further comprising:
   receiving a delete operation from a user, and, in response to said delete operation, deleting establishment of said second correlation when executing said algorithm.

5. The method as claimed in claim 4, further comprising:
   receiving an update operation from a user, and, in response to said update operation, updating establishment of said second correlation when executing said algorithm.

6. The method as claimed in claim 4, further comprising:
   receiving an alternative scanning protocol set configured by a user for said scan, and establishing a third correlation between said one modeled scan area and the alternative scanning protocol set when executing said algorithm; and
   selecting said selected scan protocol also according to said third correlation.

7. The method as claimed in claim 6, further comprising:
   receiving a delete operation from a user for said alternative scanning protocol set, and, in response to said delete operation, deleting establishment of said third correlation when executing said algorithm.

8. The method as claimed in claim 1, further comprising:
   receiving a change operation from a user for an alternative scanning protocol set and, in response to said change operation, using the alternative scanning protocol set instead of the default scanning protocol set when producing said completed scanning protocol.

9. A medical imaging apparatus comprising:
   a medical imaging scanner:
   a computer loaded with a preset virtual scanned object model, selected from the group consisting of a graphic model and an image model, said scanned object model including a plurality of modeled scan areas;
   said computer being provided with height and positioning information for a subject to be scanned in a scan of the subject conducted with the medical imaging scanner;
   said computer being provided with a manually selected default scanning protocol for operating said medical imaging scanner to conduct said scan;
   said computer being configured to execute an algorithm to select one modeled scan area, among said plurality of modeled scan areas, dependent on said height and positioning information;
   said computer being configured to further execute said algorithm to select a selected scanning protocol according to a preset correlation between said selected scanning protocol and the selected one model scan area;

said computer being configured to complete said default scanning protocol with said selected scanning protocol in order to produce a completed scanning protocol; and said computer being configured to provide control signals to said medical imaging scanner corresponding to said completed scanning protocol in order to operate said medical imaging scanner so as to conduct said scan of the subject according to said completed scanning protocol.

10. The apparatus as claimed in claim 9, wherein said computer is configured to:

determine, from said height and positioning information, a positioning direction of the subject on a table board of an examination table of the medical imaging scanner; and make a presentation direction of said virtual scanned object model coincide with said positioning direction.

11. The apparatus as claimed in claim 9 wherein said correlation is a first correlation, and wherein said computer is configured to:

execute said algorithm so as to also establish a second correlation between said one modeled scan and the default scanning protocol set; and select said selected scan protocol also according to said second correlation.

12. The apparatus as claimed in claim 9, wherein said computer is configured to:

receive a delete operation from a user, and, in response to said delete operation, delete establishment of said second correlation when executing said algorithm.

13. The apparatus as claimed in claim 12, wherein said computer is configured to:

receive an update operation from a user, and, in response to said update operation, delete establishment of said second correlation when executing said algorithm.

14. The apparatus as claimed in claim 12, wherein said computer is configured to:

receive an alternative scanning protocol set configured by a user for said scan, and establish a third correlation between said one modeled scan area and the alternative scanning protocol set; and select said selected scan protocol also according to said third correlation when executing said algorithm.

15. The apparatus as claimed in claim 14, wherein said computer is configured to:

receive a delete operation from a user for said alternative scanning protocol set, and, in response to said delete operation, delete establishment of said third correlation when executing said algorithm.

16. The apparatus as claimed in claim 9, wherein said computer is configured to:

receive a change operation from a user for an alternative scanning protocol set and, in response to said change operation, use the alternative scanning protocol set instead of the default scanning protocol set when producing said completed scanning protocol.

* * * * *